United States Patent
Feshali

(10) Patent No.: US 11,506,762 B1
(45) Date of Patent: Nov. 22, 2022

(54) OPTICAL MODULE COMPRISING AN OPTICAL WAVEGUIDE WITH REFERENCE LIGHT PATH

(71) Applicant: Apple Inc., Cupertino, CA (US)

(72) Inventor: Avi Feshali, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 377 days.

(21) Appl. No.: 16/891,390

(22) Filed: Jun. 3, 2020

Related U.S. Application Data

(60) Provisional application No. 62/904,704, filed on Sep. 24, 2019.

(51) Int. Cl.
| | |
|---|---|
| G01S 7/48 | (2006.01) |
| G01S 7/484 | (2006.01) |
| G01S 7/481 | (2006.01) |
| G01S 17/10 | (2020.01) |
| G01S 7/4865 | (2020.01) |
| G01S 7/4863 | (2020.01) |

(52) U.S. Cl.
CPC ............ *G01S 7/484* (2013.01); *G01S 7/4815* (2013.01); *G01S 7/4863* (2013.01); *G01S 7/4865* (2013.01); *G01S 17/10* (2013.01)

(58) Field of Classification Search
CPC ... G01S 7/48; G01S 7/00; G01S 17/86; G01C 3/00; G01C 3/08
USPC .......................................... 250/221, 239, 216
See application file for complete search history.

(56) References Cited

U.S. PATENT DOCUMENTS

| | | |
|---|---|---|
| 3,796,498 A | 3/1974 | Post |
| 4,850,673 A | 7/1989 | Velzel et al. |
| 5,406,543 A | 4/1995 | Kobayashi et al. |
| 5,477,383 A | 12/1995 | Jain |
| 5,606,181 A | 2/1997 | Sakuma et al. |

(Continued)

FOREIGN PATENT DOCUMENTS

| | | |
|---|---|---|
| CN | 1213244 A | 4/1999 |
| CN | 1651971 A | 8/2005 |

(Continued)

OTHER PUBLICATIONS

Fienup, J.R., "Phase Retrieval Algorithms: A Comparison", Applied Optics, vol. 21, No. 15, pp. 2758-2769, Aug. 1, 1982.

(Continued)

*Primary Examiner* — Que Tan Le
(74) *Attorney, Agent, or Firm* — Kligler & Associates Patent Attorneys Ltd

(57) ABSTRACT

An optical device includes a substrate including an optical waveguide running through the substrate. An optical transmitter mounted on the substrate in a first location includes at least one optical emitter, which emits a primary beam of optical radiation toward a target and emits a secondary beam of the optical radiation into the optical waveguide. An optical receiver mounted on the substrate in a second location includes at least one optical sensor, which receives the optical radiation that is reflected from the target and outputs a primary signal in response thereto, and receives the secondary beam of the optical radiation from the waveguide and outputs a reference signal in response to the secondary beam. A processor receives and processes the primary signal and the reference signal in order to extract information with respect to the target.

20 Claims, 1 Drawing Sheet

(56) References Cited

U.S. PATENT DOCUMENTS

| | | |
|---|---|---|
| 5,648,951 A | 7/1997 | Kato |
| 5,691,989 A | 11/1997 | Rakuljic et al. |
| 5,742,262 A | 4/1998 | Tabata et al. |
| 5,781,332 A | 7/1998 | Ogata |
| 6,002,520 A | 12/1999 | Hoch et al. |
| 6,031,611 A | 2/2000 | Rosakis et al. |
| 6,229,598 B1 | 5/2001 | Yoshida |
| 6,288,775 B1 | 9/2001 | Tanaka |
| 6,560,019 B2 | 5/2003 | Nakai |
| 6,583,873 B1 | 6/2003 | Goncharov et al. |
| 6,611,000 B2 | 8/2003 | Tamura et al. |
| 6,707,027 B2 | 3/2004 | Liess et al. |
| 6,927,852 B2 | 8/2005 | Reel |
| 6,940,583 B2 | 9/2005 | Butt et al. |
| 7,112,774 B2 | 9/2006 | Baer |
| 7,227,618 B1 | 6/2007 | Bi |
| 7,304,735 B2 | 12/2007 | Wang et al. |
| 7,335,898 B2 | 2/2008 | Donders et al. |
| 7,700,904 B2 | 4/2010 | Toyoda et al. |
| 7,916,411 B1 | 3/2011 | Lee et al. |
| 7,952,781 B2 | 5/2011 | Weiss et al. |
| 8,384,997 B2 | 2/2013 | Shpunt et al. |
| 8,466,407 B2 | 6/2013 | Martin et al. |
| 8,807,766 B2 | 8/2014 | Hung |
| 9,157,790 B2 | 10/2015 | Shpunt et al. |
| 9,201,237 B2 | 12/2015 | Chayat et al. |
| 9,202,833 B2 | 12/2015 | Mackey |
| 9,335,220 B2 | 5/2016 | Shpunt et al. |
| 10,012,831 B2 | 7/2018 | Gilboa et al. |
| 10,950,743 B2* | 3/2021 | Gopal Krishnan .. G02B 6/0053 |
| 2004/0012958 A1 | 1/2004 | Hashimoto et al. |
| 2004/0082112 A1 | 4/2004 | Stephens |
| 2005/0030305 A1 | 2/2005 | Brown et al. |
| 2005/0178950 A1 | 8/2005 | Yoshida |
| 2006/0001055 A1 | 1/2006 | Ueno et al. |
| 2006/0072100 A1 | 4/2006 | Yabe |
| 2006/0215149 A1 | 9/2006 | Labelle et al. |
| 2006/0252167 A1 | 11/2006 | Wang |
| 2006/0252169 A1 | 11/2006 | Ashida |
| 2006/0269896 A1 | 11/2006 | Liu et al. |
| 2007/0019909 A1 | 1/2007 | Yamauchi et al. |
| 2008/0198355 A1 | 8/2008 | Domenicali et al. |
| 2008/0212835 A1 | 9/2008 | Tavor |
| 2008/0240502 A1 | 10/2008 | Freedman et al. |
| 2008/0278572 A1 | 11/2008 | Gharib et al. |
| 2009/0090937 A1 | 4/2009 | Park |
| 2009/0096783 A1 | 4/2009 | Shpunt et al. |
| 2009/0183125 A1 | 7/2009 | Magal et al. |
| 2009/0185274 A1 | 7/2009 | Shpunt |
| 2009/0237622 A1 | 9/2009 | Nishioka et al. |
| 2010/0007717 A1 | 1/2010 | Spektor et al. |
| 2010/0013860 A1 | 1/2010 | Mandella et al. |
| 2010/0142014 A1 | 6/2010 | Rosen et al. |
| 2011/0019258 A1 | 1/2011 | Levola |
| 2011/0069389 A1 | 3/2011 | Shpunt |
| 2011/0075259 A1 | 3/2011 | Shpunt |
| 2011/0114857 A1 | 5/2011 | Akerman et al. |
| 2011/0141480 A1 | 6/2011 | Meissner |
| 2011/0187878 A1 | 8/2011 | Mor et al. |
| 2011/0188054 A1 | 8/2011 | Petronius et al. |
| 2011/0228251 A1 | 9/2011 | Yee et al. |
| 2011/0295331 A1 | 12/2011 | Wells et al. |
| 2012/0038986 A1 | 2/2012 | Pesach |
| 2012/0140094 A1 | 6/2012 | Shpunt et al. |
| 2012/0140109 A1 | 6/2012 | Shpunt et al. |
| 2013/0038881 A1 | 2/2013 | Pesach et al. |
| 2013/0038941 A1 | 2/2013 | Pesach et al. |
| 2013/0207970 A1 | 8/2013 | Shpunt et al. |
| 2014/0218715 A1 | 8/2014 | Li |
| 2014/0225824 A1 | 8/2014 | Shpunt et al. |
| 2014/0291491 A1 | 10/2014 | Shpunt et al. |
| 2015/0109586 A1 | 4/2015 | Masuda |
| 2016/0003944 A1 | 1/2016 | Schmidtke et al. |

FOREIGN PATENT DOCUMENTS

| | | |
|---|---|---|
| CN | 1725042 A | 1/2006 |
| CN | 1748120 A | 3/2006 |
| CN | 201378231 Y | 1/2010 |
| CN | 101874221 A | 10/2010 |
| CN | 102200431 A | 9/2011 |
| CN | 204580451 U | 8/2015 |
| DE | 102009046911 A1 | 5/2011 |
| JP | 2011118178 A | 6/2011 |
| WO | 2007/043036 A1 | 4/2007 |
| WO | 2007/105205 A2 | 9/2007 |
| WO | 2008/120217 A2 | 10/2008 |
| WO | 2010/004542 A1 | 1/2010 |
| WO | 2012020380 A1 | 2/2012 |
| WO | 2012066501 A1 | 5/2012 |

OTHER PUBLICATIONS

Awtar et al, "Two-axis Optical MEMS Scanner," Proceedings of the ASPE Annual Meeting ,Paper No. 1800, 4 pages, year 2005.

Sazbon et al., "Qualitative Real-Time Range Extraction for Preplanned Scene Partitioning Using Laser Beam Coding," Pattern Recognition Letters 26 , pp. 1772-1781, year 2005.

Gerchberg et al., "A Practical Algorithm for the Determination of the Phase from Image and Diffraction Plane Pictures," Journal Optik, vol. 35, No. 2, pp. 237-246, year 1972.

Moharam et al. "Rigorous coupled-wave analysis of planar-grating diffraction", Journal of the Optical Society of America, vol. 71, No. 6, pp. 818-818, Jul. 1981.

Eisen et al., "Total internal reflection diffraction grating in conical mounting",Optical Communications 261, pp. 13-18, year 2006.

O'Shea et al., "Diffractive Optics: Design, Fabrication and Test", SPIE Tutorial Texts in Optical Engineering, vol. TT62, pp. 66-72, SPIE Press, USA 2004.

Ezconn Czech A.S. "Site Presentation", 32 pages, Oct. 2009.

Luxtera Inc., "Luxtera Announces World's First 10GBit CMOS Photonics Platform", 2 pages, Carlsbad, USA, Mar. 28, 2005 (press release).

Bradley et al., "Synchronization and Rolling Shutter Compensation for Consumer Video Camera Arrays", IEEE International Workshop on Projector-Camera Systems—PROCAMS 2009, 8 pages, Miami Beach, Florida, 2009.

Marcia et al., "Fast Disambiguation of Superimposed Images for Increased Field of View", IEEE International Conference on Image Processing, 4 pages, San Diego, USA, Oct. 12-15, 2008.

Btendo, "Two Uni-axial Scanning Mirrors Vs One Bi-axial Scanning Mirror", 4 pages, Kfar Saba, Israel, Aug. 13, 2008.

Microvision Inc., "Micro-Electro-Mechanical System (MEMS) Scanning Mirror", 1 page, years 1996-2009.

Garcia et al.., "Projection of Speckle Patterns for 3D Sensing", Journal of Physics, Conference series 139, 7 pages, year 2008.

Garcia et al., "Three-dimensional mapping and range measurement by means of projected speckle patterns", Applied Optics, vol. 47, No. 16, pp. 3032-3040, Jun. 1, 2008.

O'Connor et al., # U.S. Appl. No. 16/574,129, filed Sep. 18, 2019.

EP Application 201825189 Search Report dated Dec. 10, 2020.

U.S. Appl. No. 16/574,129 Office Action dated Jun. 5, 2022.

* cited by examiner

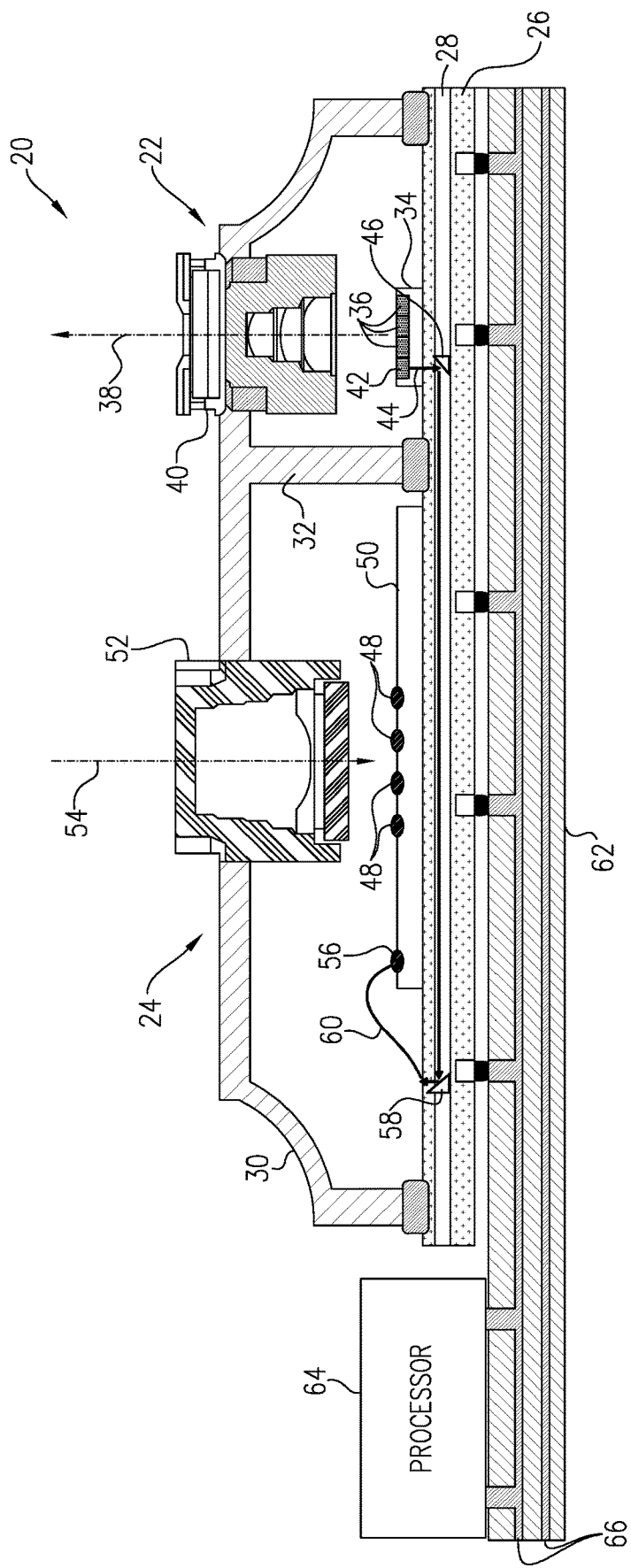

OPTICAL MODULE COMPRISING AN OPTICAL WAVEGUIDE WITH REFERENCE LIGHT PATH

CROSS-REFERENCE TO RELATED APPLICATION

This application claims the benefit of U.S. Provisional Patent Application 62/904,704, filed Sep. 24, 2019, which is incorporated herein by reference.

FIELD OF THE INVENTION

The present invention relates generally to devices and methods for optical sensing, and particularly to optical transmitter/receiver modules.

BACKGROUND

Some types of optical sensing systems include an optical transmitter, which transmits a beam of optical radiation toward a target, and an optical receiver, which collects and senses the optical radiation that is reflected from the target. (The term "optical radiation," in the context of the present description and in the claims, refers to electromagnetic radiation in any of the visible, infrared, and ultraviolet spectral ranges, and may be used interchangeably with the term "light.") For example, in some depth sensing systems, the transmitter emits pulses of radiation toward a target, and the optical receiver senses the times of flight (ToF) of the pulses, and thus measures the distance to the target.

For many sensing applications, including ToF-based depth sensing, it can be advantageous to package the transmitter and receiver together on the same substrate in a compact package. An integrated optoelectronic module of this sort is described, for example, in U.S. Pat. No. 9,157,790.

ToF-based depth sensing devices are often subject to stray reflections, which reflect or otherwise scatter from optical surfaces within the device back toward the receiver. In general, such stray reflections are regarded as noise, and designers of the devices do their best to eliminate them. On the other hand, U.S. Pat. No. 9,335,220, whose disclosure is incorporated herein by reference, describes a ToF-based scanner in which the stray reflections are used intentionally in calibrating the ToF measurements. In the disclosed scanner, a transmitter emits a beam comprising optical pulses toward a scene, and a receiver receives reflections of the optical pulses and outputs electrical pulses in response thereto. Processing circuitry is coupled to the receiver so as to receive, in response to each of at least some of the optical pulses emitted by the transmitter, a first electrical pulse output by the receiver at a first time due to stray reflection within the apparatus and a second electrical pulse output by the receiver at a second time due to the beam reflected from the scene. The processing circuitry generates a measure of the time of flight of the optical pulses to and from points in the scene by taking a difference between the respective first and second times of output of the first and second electrical pulses.

SUMMARY

Embodiments of the present invention that are described hereinbelow provide improved devices for optical transmission and reception, particularly (though not exclusively) for use in ToF-based depth sensing.

There is therefore provided, in accordance with an embodiment of the invention, an optical device, including a substrate having upper and lower surfaces and including an optical waveguide running through the substrate along a path parallel to the upper surface. An optical transmitter is mounted on the upper surface of the substrate in a first location and includes at least one optical emitter, which is configured to emit a primary beam of optical radiation toward a target and is coupled to emit a secondary beam of the optical radiation into the optical waveguide. An optical receiver is mounted on the upper surface of the substrate in a second location and includes at least one optical sensor, which is configured to receive the optical radiation that is reflected from the target and to output a primary signal in response to the reflected optical radiation, and which is coupled to receive the secondary beam of the optical radiation from the waveguide and to output a reference signal in response to the secondary beam. A processor is configured to receive and process the primary signal and the reference signal in order to extract information with respect to the target.

In some embodiments, the substrate includes a semiconductor wafer. In one such embodiment, the optical waveguide is disposed on the semiconductor wafer and includes a material selected from the group of materials consisting of silicon and silicon nitride. Alternatively, the substrate includes a printed circuit board in which the optical waveguide is embedded.

In some embodiments, the at least one optical emitter includes an array of emitters, including a reference emitter, which is configured to emit the secondary beam into the optical waveguide. In a disclosed embodiment, the emitters in the array, including the reference emitter, are configured to emit pulsed beams of the optical radiation in mutual synchronization. Additionally or alternatively, the optical transmitter includes a semiconductor die, on which the emitters are disposed, and the reference emitter is configured to emit the secondary beam through the semiconductor die into the optical waveguide. Further additionally or alternatively, the emitters includes vertical-cavity surface-emitting lasers (VCSELs).

In some embodiments, the at least one optical sensor includes an array of sensors, including a reference sensor, which is coupled to receive the secondary beam of the optical radiation from the waveguide. In a disclosed embodiment, the sensors include avalanche diodes, such as single-photon avalanche diodes (SPADs). Additionally or alternatively, the processor is configured to apply the reference signal in calibrating a breakdown voltage of the avalanche diodes.

In a disclosed embodiment, the at least one emitter is configured to emit pulses of the optical radiation toward the target, and the primary signal is indicative of times of arrival of the pulses reflected from the target, and wherein the processor is configured to apply the reference signal in processing the primary signal so as to find times of flight of the pulses to and from the target.

In one embodiment, the device includes a housing, which contains the optical transmitter and the optical receiver and includes a partition configured to prevent leakage of the optical radiation from the optical transmitter to the optical receiver within the housing.

There is also provided, in accordance with an embodiment of the invention, a method for producing an optical device. The method includes providing a substrate having upper and lower surfaces and including an optical waveguide running through the substrate along a path parallel to the upper surface. An optical transmitter is mounted on the upper surface of the substrate in a first location and includes at least one optical emitter, which is configured to emit a primary beam of optical radiation toward a target. The optical transmitter is coupled to emit a secondary beam of the optical radiation into the optical waveguide. An optical receiver is mounted on the upper surface of the substrate in a second location and includes at least one optical sensor, which is configured to receive the optical radiation that is reflected from the target and to output a primary signal in response to the reflected optical radiation. The optical sensor is coupled to receive the secondary beam of the optical radiation from the waveguide and to output a reference signal in response to the secondary beam. The primary signal and the reference signal are processed in order to extract information with respect to the target.

The present invention will be more fully understood from the following detailed description of the embodiments thereof, taken together with the drawings in which:

BRIEF DESCRIPTION OF THE DRAWINGS

FIG. 1 is a schematic sectional view of an optical module, in accordance with an embodiment of the invention.

DETAILED DESCRIPTION OF EMBODIMENTS

In designing an optical module that includes a transmitter and a receiver, it is important to minimize the amount of stray radiation that reaches the receiver, and particularly stray radiation emitted from the transmitter toward the receiver. This radiation is "stray" in the sense that it does not exit the module along the intended transmit path toward the target and then return from there to the receiver through the objective lens assembly, but rather reflects internally with the module, typically from one or more of the optical or mechanical surfaces in the module. Even a small amount of this sort of stray radiation can severely degrade the performance of the optical module, by adding substantial noise to the signals output by the receiver. Modules that use stray radiation as a zero-reference for ToF measurements, for example as described in the above-mentioned U.S. Pat. No. 9,335,220, must generally be designed with care in order to avoid this sort of performance degradation.

Embodiments of the present invention that are described herein address this problem by providing a well-controlled path for conveying an optical reference beam from the transmitter to the receiver. By virtue of the use of this sort of reference path, the receiver may be completely partitioned off from the transmitter within the device housing, so as to prevent any uncontrolled leakage of stray radiation from the transmitter to the receiver.

In the embodiments described hereinbelow, an optical transceiver device comprises a substrate, such as a semiconductor wafer or a suitable printed circuit, with an upper surface on which the optical transmitter and optical receiver are mounted. An optical waveguide runs through the substrate along a path parallel to the upper surface. When the substrate comprises a silicon wafer, and the transmitter emits infrared radiation, for example, the waveguide may comprise a silicon or silicon nitride, waveguide, depending upon the wavelength of the radiation.

The optical transmitter emits a primary beam of optical radiation toward a target, while emitting a secondary beam of the optical radiation into the optical waveguide. This secondary beam may be split off from the primary beam; or alternatively, the transmitter may comprise an array of emitters, one of which serves as a reference emitter to emit the secondary beam toward the substrate and into the waveguide. The optical receiver comprises at least one optical sensor, which receives the optical radiation that is reflected from the target and outputs a primary signal in response to this received radiation. The optical receiver also receives the secondary beam from the waveguide and outputs a reference signal in response to the secondary beam. (The optical receiver may likewise comprise an array of sensors, one of which serves as a reference sensor and receives the secondary beam.)

A processor receives and processes the primary signal and the reference signal in order to extract information with respect to the target. For example, as noted above, the optical transmitter may emit pulses of optical radiation toward the target, with the primary signal being indicative of times of arrival of the pulses reflected from the target. The processor may then apply the reference signal as a zero-reference in processing the primary signal so as to find times of flight of the pulses to and from the target. Additionally or alternatively, the reference signal may be used in calibration of the breakdown voltage (VBD) of avalanche detectors (such as SPADs) that are used in the receiver to ensure that the sensor or sensors are operating at the correct bias.

FIG. 1 is a schematic sectional view of an optical module 20, in accordance with an embodiment of the invention. Module 20 comprises an optical transmitter 22 and an optical receiver 24, which are mounted one alongside the other on a substrate 26. In the present example, substrate 26 comprises a semiconductor wafer, such as a silicon wafer, with an optical waveguide 28 running through the substrate along a path parallel to the upper surface of the substrate, on which transmitter 22 and receiver 24 are mounted. Transmitter 22 and receiver 24 are contained in a housing 30, comprising a partition 32 that completely separates the transmitter from the receiver and thus prevents leakage of optical radiation from the transmitter to the receiver within the housing.

Waveguide 28 may comprise silicon or silicon nitride, for example. Such a waveguide may be fabricated on a semiconductor wafer by techniques of thin-film deposition and photolithography that are known in the art. Although a silicon waveguide may be used for longer infrared wavelengths, in excess of 1000 nm, SiN is preferable for shorter wavelengths, such as 940 nm. Alternatively, substrate 26 may comprise an electro-optical printed circuit board with an embedded waveguide, such as those produced by vario-optics ag (Heiden, Switzerland), or any other suitable substrate material that is capable of conveying optical and electrical signals to and from transmitter 22 and receiver 24.

Transmitter 22 comprises an optical emitter die 34, on which one or more emitters 36 are formed or otherwise disposed. For example, emitters 36 may comprise a suitable light-emitting diode (LED) or laser, such as a vertical-cavity surface-emitting laser (VCSEL), or an array of such LEDs or lasers, which may emit pulsed, continuous, or modulated radiation. In the pictured embodiment, emitter die comprises an array of emitters 36, which emit a primary beam 38 of optical radiation. A transmission lens assembly 40 collects and directs primary beam 38 along a transmit axis toward a target (not shown in the figures).

Transmission lens assembly 40 comprises one or more lenses (multiple lenses in the pictured example), which are mounted in a lens barrel. Alternatively, other optical configurations may be used.

The array of emitters on die 34 also includes a reference emitter 42, which emits a secondary beam 44 into optical waveguide 28. For example, when emitters 36 emit pulsed beams (as in ToF-sensing applications), reference emitter 42 also emits pulses in synchronization with emitters 36. In the pictured example, while emitters 36 emit their beams in the forward direction, away from die 34, reference emitter 42 emits secondary beam 44 in the opposite direction, through die 34 into the optical waveguide. Die 34 may be transparent to the radiation emitted by reference emitter 42; or alternatively, the die may be thinned or opened behind emitter 42 to enable secondary beam 44 to pass through. In the pictured embodiment, a reflector 46 deflects the secondary beam into waveguide 28.

Receiver 24 in the present embodiment comprises an array of optical sensors 48, for example avalanche diodes, such as an avalanche photodiode (APD) or a single-photon avalanche diode (SPAD) or an array of such sensors, or alternatively a sensor or sensor array that is capable of continuous or gated sensing. Sensors 48 are formed or otherwise mounted on a receiver die 50, which may comprise, for example, a III-V semiconductor, such as GaAs, or silicon, or possibly a III-V sensor die bonded onto a silicon logic die containing pixel circuits for sensors 48. An objective lens assembly 52, comprising one or more lenses mounted in a lens barrel, for example, focuses optical radiation 54 that is reflected from the target along a receive axis onto optical sensors 48.

A reference sensor 56 is also disposed on receiver die 50 and is coupled to receive the secondary beam of optical radiation from waveguide 28. In the pictured example, a reflector 58 deflects the secondary beam upwards from waveguide 28, and a photonic wire bond 60 (i.e., an optical fiber, which is suitably bonded at its ends) conveys the beam to reference sensor 56. (A photonic wire bond of this sort may also be used to connect reference emitter 42 to optical waveguide 28.) Alternatively, the secondary beam may be transmitted to reference sensor 56 through die 50 or through an opening in the die. As a further option, when receiver die 50 comprises bonded III-V and Si dies, the reference sensor may be implemented as a part of the pixel logic on the Si die.

Substrate 26 is mounted on a circuit board 62, together with a processor 64. Alternatively, processor 64 (or at least some of the functional components of the processor) may be mounted in a different location, and need not be dedicated to module 20. For example, the functions of processor 64 may be carried out by a suitable system on chip (SoC) in a host device, such as a mobile telephone, in which module is incorporated. Circuit board 62 comprises a ceramic or polymer substrate, for example, with circuit traces 66 that connect transmitter die 34 and receiver die 50 to processor 64 and other components (not shown) of device 20. Processor 64 receives and processes a primary signal output by optical sensors 48 in response to optical radiation 54, together with a reference signal output by reference sensor 56 in response to the secondary beam received through waveguide 28. Based on these signals, the processor extracts information with respect to the target from which optical radiation 54 has reflected.

Typically, processor 64 comprises suitable hardware logic circuits, which may be hard-wired or programmable, for extracting timing and/or intensity information from the primary and reference signals, together with interfaces to transmitter 22 and receiver 24. For example, as noted earlier, processor 64 may apply the reference signal as a zero-reference in processing the primary signal so as to find times of flight of optical pulses to and from the target. Additionally or alternatively, processor 64 may comprise a drive circuit, which drives transmitter 22. Further additionally or alternatively, processor 64 may comprise a programmable microprocessor or microcontroller, which operates under the control of software or firmware. Although processor 64 is shown in FIG. 1, for the sake of simplicity, as a unitary functional block, in practice the functions of the processor may be distributed among multiple component, such as in the logic circuits on die 50.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optical device, comprising:
a substrate having upper and lower surfaces and comprising an optical waveguide running through the substrate along a path parallel to the upper surface;
an optical transmitter, which is mounted on the upper surface of the substrate in a first location and comprises at least one optical emitter, which is configured to emit a primary beam of optical radiation toward a target and is coupled to emit a secondary beam of the optical radiation into the optical waveguide;
an optical receiver, which is mounted on the upper surface of the substrate in a second location and comprises at least one optical sensor, which is configured to receive the optical radiation that is reflected from the target and to output a primary signal in response to the reflected optical radiation, and which is coupled to receive the secondary beam of the optical radiation from the waveguide and to output a reference signal in response to the secondary beam; and
a processor, which is configured to receive and process the primary signal and the reference signal in order to extract information with respect to the target.

2. The device according to claim 1, wherein the substrate comprises a semiconductor wafer.

3. The device according to claim 2, wherein the optical waveguide is disposed on the semiconductor wafer and comprises a material selected from the group of materials consisting of silicon and silicon nitride.

4. The device according to claim 1, wherein the substrate comprises a printed circuit board in which the optical waveguide is embedded.

5. The device according to claim 1, wherein the at least one optical emitter comprises an array of emitters, including a reference emitter, which is configured to emit the secondary beam into the optical waveguide.

6. The device according to claim 5, wherein the emitters in the array, including the reference emitter, are configured to emit pulsed beams of the optical radiation in mutual synchronization.

7. The device according to claim 5, wherein the optical transmitter comprises a semiconductor die, on which the emitters are disposed, and the reference emitter is configured to emit the secondary beam through the semiconductor die into the optical waveguide.

8. The device according to claim 5, wherein the emitters comprises vertical-cavity surface-emitting lasers (VCSELs).

9. The device according to claim 1, wherein the at least one optical sensor comprises an array of sensors, including a reference sensor, which is coupled to receive the secondary beam of the optical radiation from the waveguide.

10. The device according to claim 9, wherein the sensors comprise avalanche diodes.

11. The device according to claim 10, wherein the avalanche diodes comprise single-photon avalanche diodes (SPADs).

12. The device according to claim 10, wherein the processor is configured to apply the reference signal in calibrating a breakdown voltage of the avalanche diodes.

13. The device according to claim 1, wherein the at least one emitter is configured to emit pulses of the optical radiation toward the target, and the primary signal is indicative of times of arrival of the pulses reflected from the target, and wherein the processor is configured to apply the reference signal in processing the primary signal so as to find times of flight of the pulses to and from the target.

14. The device according to claim 1, and comprising a housing, which contains the optical transmitter and the optical receiver and comprises a partition configured to prevent leakage of the optical radiation from the optical transmitter to the optical receiver within the housing.

15. A method for producing an optical device, the method comprising:
  providing a substrate having upper and lower surfaces and comprising an optical waveguide running through the substrate along a path parallel to the upper surface;
  mounting on the upper surface of the substrate in a first location an optical transmitter comprising at least one optical emitter, which is configured to emit a primary beam of optical radiation toward a target;
  coupling the optical transmitter to emit a secondary beam of the optical radiation into the optical waveguide;
  mounting on the upper surface of the substrate in a second location an optical receiver comprising at least one optical sensor, which is configured to receive the optical radiation that is reflected from the target and to output a primary signal in response to the reflected optical radiation;
  coupling the optical sensor to receive the secondary beam of the optical radiation from the waveguide and to output a reference signal in response to the secondary beam; and
  processing the primary signal and the reference signal in order to extract information with respect to the target.

16. The method according to claim 15, wherein the at least one optical emitter comprises an array of emitters, including a reference emitter, which is configured to emit the secondary beam into the optical waveguide.

17. The method according to claim 16, wherein the emitters in the array, including the reference emitter, are configured to emit pulsed beams of the optical radiation in mutual synchronization.

18. The method according to claim 15, wherein the at least one optical sensor comprises an array of sensors, including a reference sensor, which is coupled to receive the secondary beam of the optical radiation from the waveguide.

19. The method according to claim 18, wherein the sensors comprise avalanche diodes, and the method comprises applying the reference signal in calibrating a breakdown voltage of the avalanche diodes.

20. The method according to claim 15, wherein the at least one emitter is configured to emit pulses of the optical radiation toward the target, and the primary signal is indicative of times of arrival of the pulses reflected from the target, and wherein processing the primary signal and the reference signal comprises applying the reference signal in processing the primary signal so as to find times of flight of the pulses to and from the target.

* * * * *